(12) United States Patent
Chang et al.

(10) Patent No.: US 6,554,195 B1
(45) Date of Patent: Apr. 29, 2003

(54) DUAL PROCESSOR ADAPTER CARD

(75) Inventors: Nai-Shung Chang, Taipei Hsien (TW);
Lie-Wen Chen, Taipei Hsien (TW);
Ching-Fu Chuang, Taipei (TW);
Chia-Hsing Yu, Taipei Hsien (TW)

(73) Assignee: Via Technologies, Inc., Taipei Hsien (TW)

( * ) Notice: Subject to any disclaimer, the term of this patent is extended or adjusted under 35 U.S.C. 154(b) by 0 days.

(21) Appl. No.: 09/422,020

(22) Filed: Oct. 20, 1999

(30) Foreign Application Priority Data

Jun. 24, 1999 (TW) .......................... 88110635 A

(51) Int. Cl.[7] .............................................. G06K 19/06
(52) U.S. Cl. ........................................ 235/492; 710/62
(58) Field of Search ........................... 235/492, 487; 710/62–74, 100–103

(56) References Cited

U.S. PATENT DOCUMENTS

| | | | | |
|---|---|---|---|---|
| 5,041,009 A | * | 8/1991 | McCleerey | 439/405 |
| 5,617,546 A | * | 4/1997 | Shih et al. | 395/307 |
| 5,628,637 A | * | 5/1997 | Pecone et al. | 439/74 |
| 5,812,800 A | * | 9/1998 | Gulick et al. | 395/308 |
| 5,892,660 A | * | 4/1999 | Farnsworth et al. | 361/728 |
| 5,919,259 A | * | 7/1999 | Dahl | 713/300 |
| 5,930,496 A | * | 7/1999 | MacLaren et al. | 395/500 |
| 6,027,350 A | * | 2/2000 | Chen et al. | 439/159 |
| 6,030,254 A | * | 2/2000 | Johnson et al. | 439/496 |
| 6,113,425 A | * | 9/2000 | Yee | 439/607 |
| 6,122,175 A | * | 9/2000 | Shieh | 361/737 |
| 6,122,695 A | * | 9/2000 | Cronin | 710/126 |

\* cited by examiner

*Primary Examiner*—Michael G. Lee
*Assistant Examiner*—Jamara A. Franklin
(74) *Attorney, Agent, or Firm*—J.C. Patents

(57) ABSTRACT

A dual processor adapter card with a plurality of electrical pins for inserting into a processor slot on a mainboard by which the adapter card is electrically coupled to the mainboard. There is a first and a second processor socket on the adapter card for carrying a first and a second processor respectively. The first and the second processor socket each has a plurality of corresponding pins, a portion of the pins of the first and the second processor socket corresponds to a portion of the electrical pins. Corresponding pins are coupled together. Furthermore, each of the pins that act as a terminal lead in the first and the second processor socket is connected to a pull-up resistor, and the pull-up resistor is connected to a terminal voltage. In addition, a zero-delay buffer for synchronizing clock pulse signals and a voltage regulator for regulating a power voltage into a suitable working voltage are mounted on the adapter card and coupled to the first and the second processor socket respectively.

20 Claims, 3 Drawing Sheets

DUAL PROCESSOR ADAPTER CARD

CROSS-REFERENCE TO RELATED APPLICATION

This application claims the priority benefit of Taiwan application serial no. 88110635, filed Jun. 24, 1999, the full disclosure of which is incorporated herein by reference.

BACKGROUND OF THE INVENTION

1. Field of Invention

The present invention relates to an adapter card having dual central processing units (CPUs) architecture. More particularly, the present invention relates to an adapter card having dual central processing units (CPUs) architecture for a mainboard having one CPU slot.

2. Description of Related Art

The core element of a mainboard is a central processing unit (CPU). According to the structure and package of the CPU such as K6, K6-2, socket 370 or slot 1, the CPU can be engaged to the mainboard in many ways. Slot 1 is used for engaging Pentium II or III class of CPUs. Pentium II or III class of CPUs is capable of supporting dual processors while the other types cannot.

Currently, attempts have been made to utilize the two slot 1 type of slots on a mainboard. A pair of adapter cards each having a socket 370 type of CPU thereon is formed. The adapter cards are then inserted into the slot 1 type of slots respectively. However, this arrangement is only feasible for a mainboard having a pair of slots. Since most of the mainboard are still of the single slot type, users of the single slot board are unable to reap the benefits of operating a double processor system.

SUMMARY OF THE INVENTION

Accordingly, one object of the present invention is to provide an adapter card having two processor sockets thereon for the engagement of two processors.

A second object of the invention is to provide a dual processor adapter card so that a pair of processors can be used without the need to modify the original layout of a main circuit board.

A third object of the invention is to provide a dual processor adapter card capable of plugging into the slot on a mainboard so that the pair of processors can be utilized. There is no need to modify the original layout of the mainboard except to change the circuit layout on the adapter card and update the content of the basic input/output system (BIOS).

A fourth object of the invention is to provide a dual processor adapter card capable of using cheaper processors whose performance is superior to that of the Pentium II or III class of processors.

To achieve these and other advantages and in accordance with the purpose of the invention, as embodied and broadly described herein, the invention provides a dual processor adapter card. The adapter card comprises a first processor socket and a second processor socket, a zero-delay buffer and a voltage regulator.

The adapter card has a plurality of electrical pins such as a gold fingers structure. When the adapter card is inserted into the processor slot of a mainboard, the processors are electrically connected to the mainboard through the gold fingers. The first and the second processor sockets are mounted on the adapter card. Each of the processor sockets has a plurality of pins that correspond to each other. Moreover, a portion of the pins on the first processor socket and the second processor sockets corresponds to the electrical pins or gold fingers on the adapter card as well. In other words, a daisy chain method is used to receive or transmit the same signal to various corresponding pins. Among the various pins of the first and the second processor socket, the pins that serve as a terminal is coupled to a pull-up resistor, and then connected to a terminal voltage. The zero-delay buffer is also mounted on the adapter card for providing synchronous clock signals to a first and a second processor on the first and the second processor socket respectively. The voltage regulator is similarly mounted on the adapter card for converting a supply voltage to a voltage suitable for operating the first and the second processor on the adapter card.

In actual application, two processors having a socket 370 specification, for example, can be installed on the adapter card of this invention. The adapter card can be inserted into a slot that uses a slot 1 specification. Hence, all mainboards having a slot 1 type of slot can use low cost processors to upgrade into a dual processor computer.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1A:
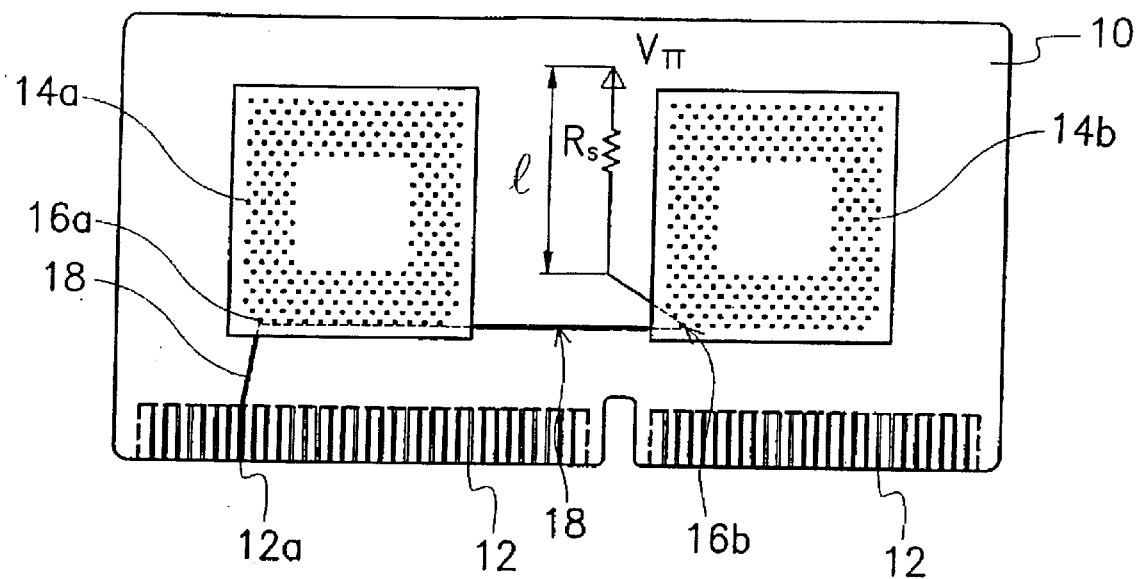
FIGS. 1A and 1B are schematic, side views of a dual adapter card showing a connection from a pin of one processor socket to another and a connection from a pin of one processor socket to a gold finger according to this invention.

Reference will now be made in detail to the present preferred embodiments of the invention, examples of which are illustrated in the accompanying drawings. Wherever possible, the same reference numbers are used in the drawings and the description to refer to the same or like parts.

One major object of this invention is to design a circuit on an adapter card such that two central processing units (CPUs) having a socket 370 configuration are formed on the adapter card. Hence, even if a mainboard having a single slot 1 type slot is only available, dual processor functions is still possible by inserting the adapter card. Because both CPUs are on the same adapter card, correct clock pulse signals and voltages from a gold finger must be distributed to each of the processors.

Figure 1B:
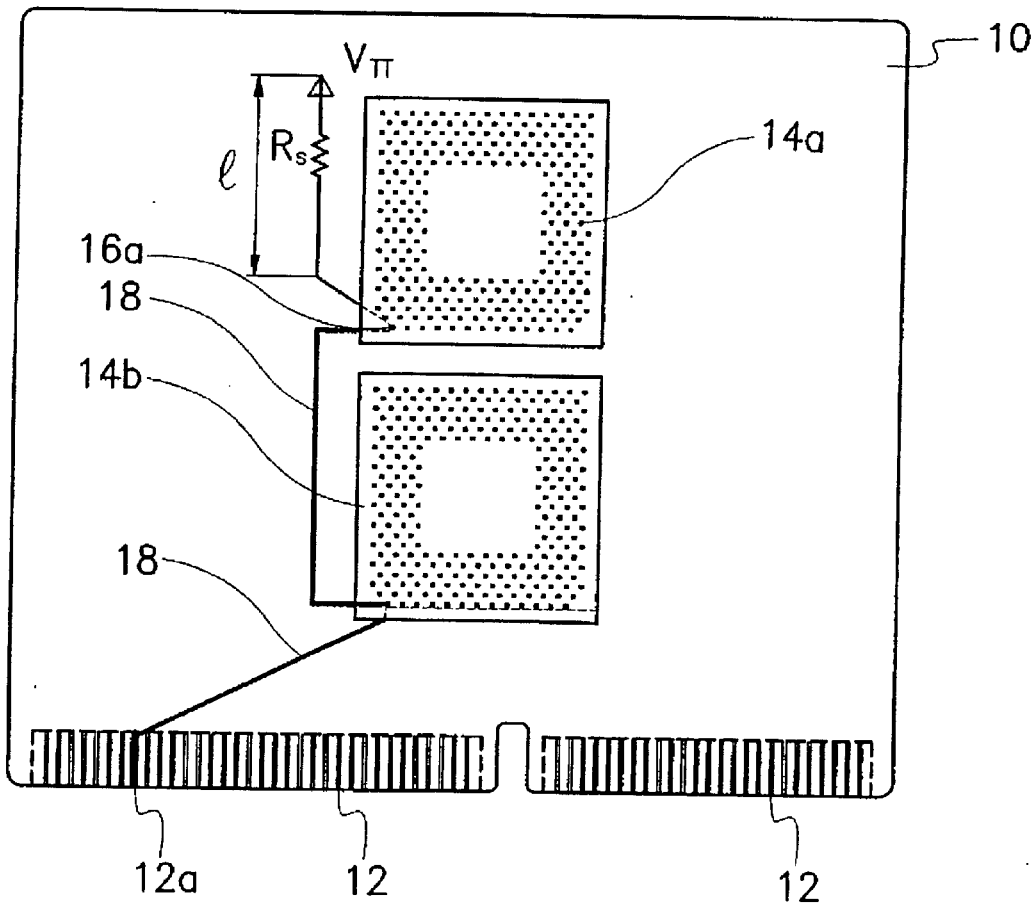

FIGS. 1A and 1B are schematic, side views of a dual processor adapter card showing two possible configuration of a connection from a pin of one processor socket to another and a connection from a pin of one processor socket to a gold finger according to this invention. As shown in FIGS. 1A and 1B, the adapter card 10 has a plurality of electrical pins such as a gold-fingers structure 12 for inserting into a slot of a mainboard. Hence, the processors on the adapter card are electrically connected to the mainboard. The processor slot on the mainboard can be, for example, a slot having a slot 1 specification.

A first processor socket 14a and a second processor socket 14b are installed on the adapter card 10. The first and the second processor sockets 14a and 14b can be, for example, a socket having a socket 370 specification. Furthermore, there are a plurality of pinholes in the sockets 14a and 14b for mounting a processor. When identical processors are used in the adapter card 10, position of pins between the two processors will correspond. In other words, pins for receiving or transmitting signals will be identical. Because the gold fingers 12 on the adapter card 10 are aiming at single processor design, a portion of the gold fingers 12 have to couple with corresponding contact points on both processor sockets 14a and 14b. In addition, some of the pins on corresponding positions of the processor sockets 14a and 14b have to be linked as well.

In FIGS. 1A and 1B, one of the gold finger pins 12a is connected to two corresponding pins 16a and 16b on the processor sockets 14a and 14b. Note that the connection in FIGS. 1A and 1B is an illustration of the layout concept only, and it should by no means be construed as a limitation to the scope of this invention.

A daisy chain method is a preferable layout for the adapter card 10 according to the present invention. In other words, for the same signal line such as 18, identical devices (in here, pins corresponding to positions of the processor sockets 14a and 14b) are linked together. To improve the quality of the signal line 18 even further, a pull-up resistor $R_S$ is connected to the end of the pin. This pull-up resistor $R_S$ is then connected to a terminal voltage $V_{TT}$ having a voltage of about 1.0V. The pull-up resistor $R_S$ can be designed to have a resistance of about 56 Ohms, thereby forming a GTL (gunning transceiver logic) type of transmission line. Furthermore, the length between the terminal voltage $V_{TT}$ and the pin 16b through pull-up resistor is preferably separated by a distance l of about one inch.

The pull-up resistor of each signaling line does not necessarily have to be on one side of the second processor socket 14b. In reality, the layout on the adapter card 10 should be optimized according to the practical layout.

In the design of a dual processor adapter card, a second consideration is the synchronization of clock pulse signals to each of the processor. To synchronize both processors, signals must be sent to the first and the second processor sockets 14a and 14b without any delays. However, a mainboard with a single slot has only one clock pulse generator. To resolve the problem, a zero-delay buffer is installed on the adapter card 10.

Figure 2A:
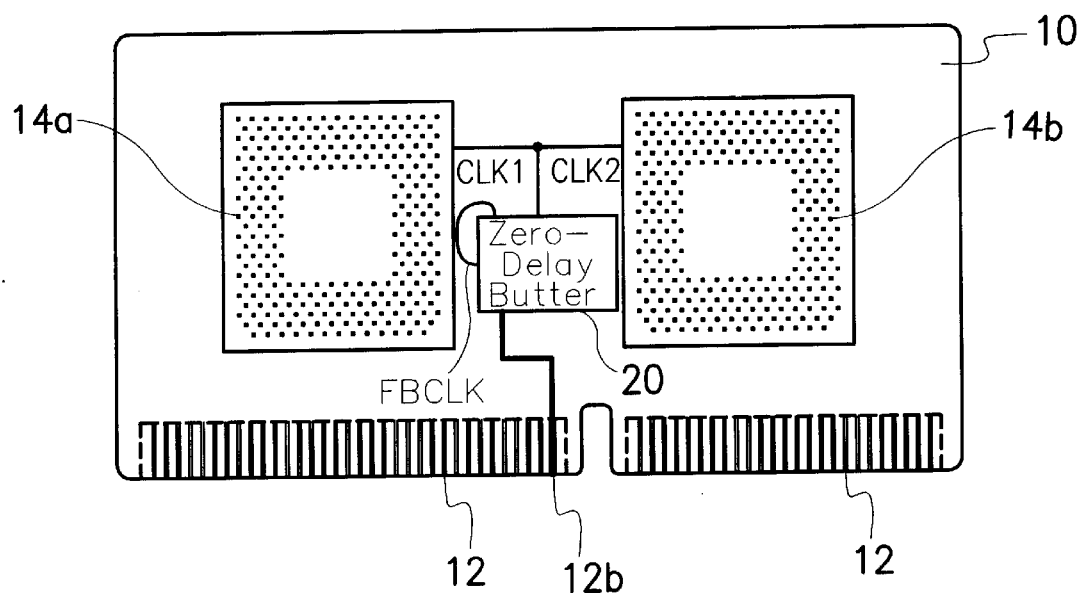
FIGS. 2A and 2B are schematic, side views of a dual processor adapter card showing the schematic layout of a zero-delay buffer that synchronizes clock signals from a clock pulse generator according to this invention.
Figure 2B:
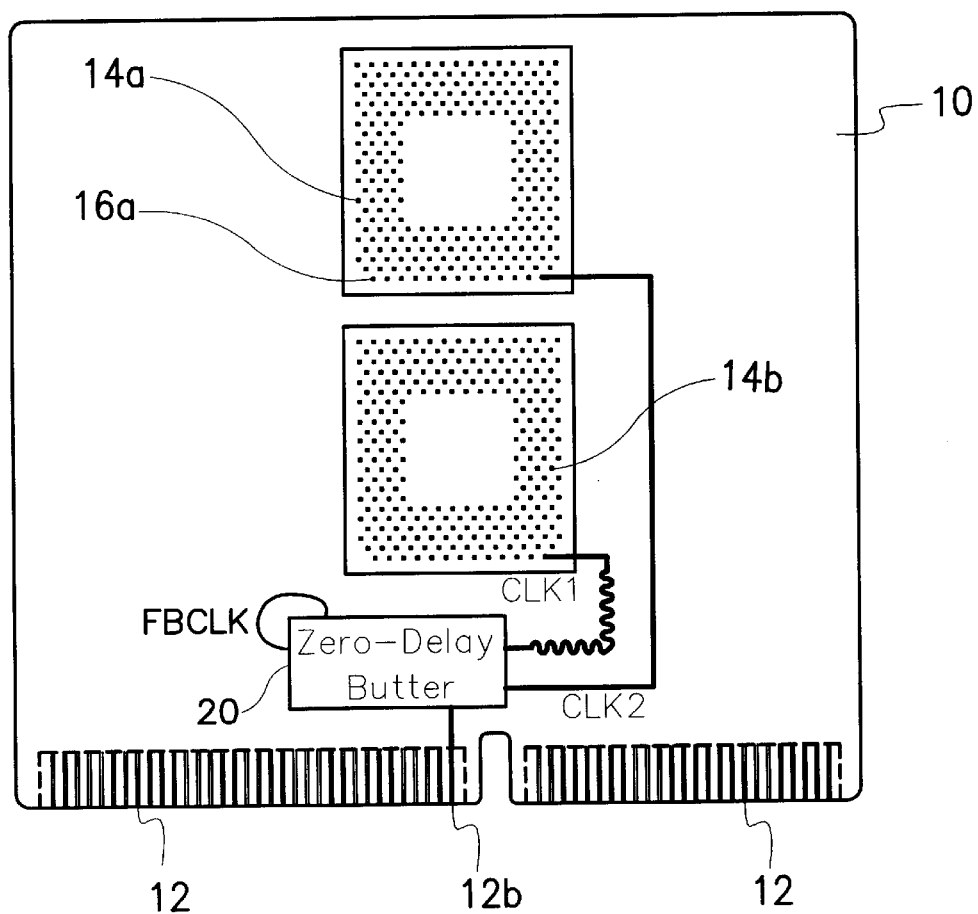

FIGS. 2A and 2B are schematic, side views of a dual processor adapter card showing two possible layout of a zero-delay buffer that synchronizes clock signals from a clock pulse generator according to this invention. The zero-delay buffer 20 is positioned at a convenient location on the adapter card 10 and receives the clock signal from the mainboard via one of the gold fingers, the clock pin 12b. Thereafter, synchronized clock pulse signals CLK1 and CLK2 are redirected from the zero-delay buffer 20 to the respective pins on the processor sockets 14a and 14b. To prevent any phase shift of clock signals CLK1 and CLK2, the layout must be precisely laid so that signals from the zero-delay buffer 20 travel identical distances to the processor sockets 14a and 14b. Furthermore, a feedback signal line FBCLK shown in FIGS. 2A and 2B is needed. There are several conventional methods of carrying out the actual layout. Since these methods should be familiar to people skill in layout design, detailed descriptions are omitted here. Similarly, advanced peripheral input/output control (APIC) clock pulse signal can also rely on the aforementioned method to achieve a zero delay. The APIC is capable of controlling the operations between two processors.

One of the main objects of the dual processor adapter card of this invention is to enable two socket 370 processors to be used on a single slot (having a slot 1 specification) mainboard. In addition to the core voltage $V_{core}$, it is necessary to provide another voltage of 2.5V for the processor with the socket 370 specification. However, the mainboard with slot 1 slot does not provide the voltage of 2.5V and not meet the requirement of socket 370 processor. Therefore, the adapter card 10 must have a voltage regulator to regulate voltage.

Figure 3A:
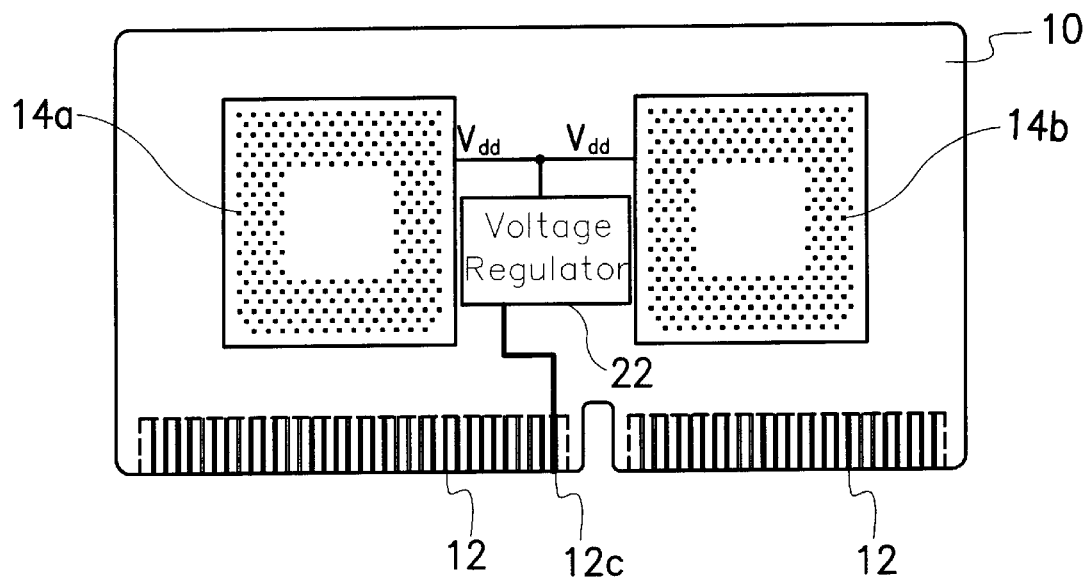
FIGS. 3A and 3B are schematic, side views of a dual processor adapter card showing the schematic layout of a voltage regulator that regulates the voltage to each processor according to this invention.
Figure 3B:
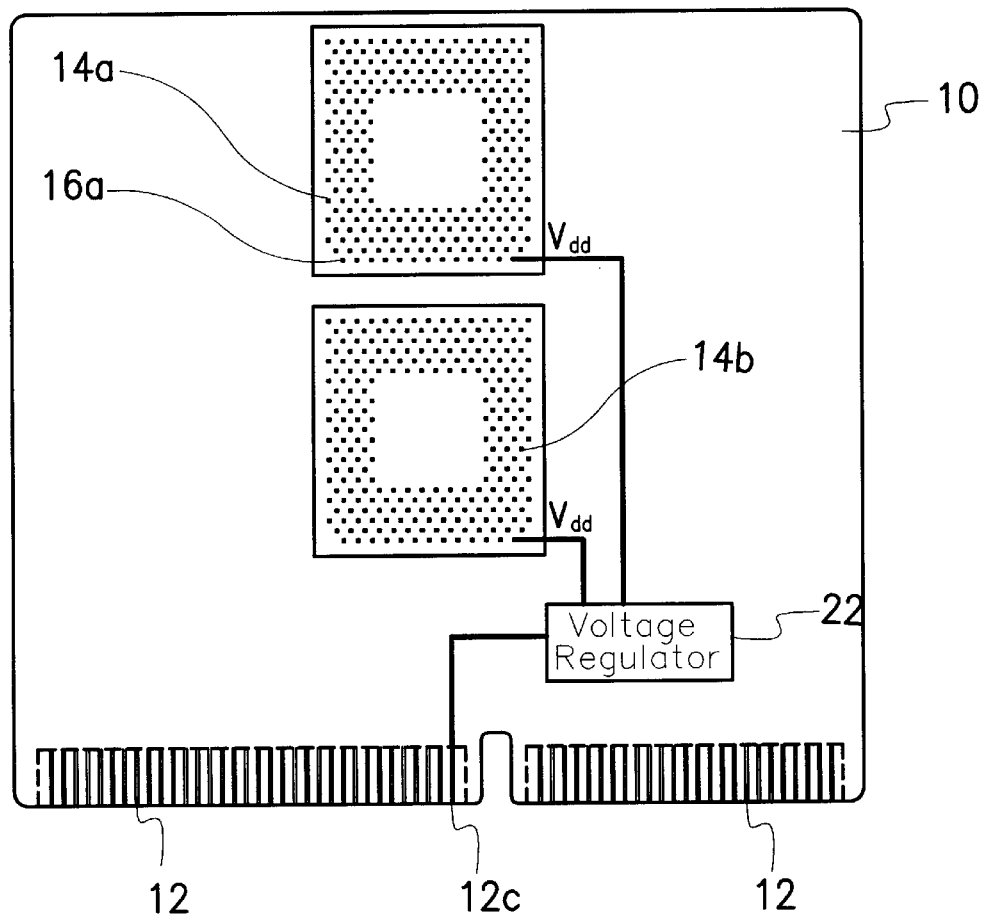

FIGS. 3A and 3B are schematic, side views of a dual processor adapter card showing two possible layout of a voltage regulator that regulates the voltage to each processor according to this invention. As shown in FIGS. 3A and 3B, the voltage regulator 22 is positioned at a convenient location on the adapter card 10. The voltage regulator 22 is able to convert a power voltage from the mainboard to a voltage suitable for operating both processors on the sockets 14a and 14b. In this example, the voltage regulator 22 can be a linear regulator having a voltage regulating range between 5V to 2.5V.

The voltage regulator 22 receives a core voltage $V_{core}$, 5V, from the mainboard via one of the gold fingers 12, the core voltage pin 12c. The core voltage $V_{core}$, 5V is then regulated by the voltage regulator 22 to a voltage of 2.5V that will be distributed to the corresponding pins on the processor socket 14a, 14b.

Furthermore, the contents of the basic input/output system (BIOS) are updated so that the mainboard is able to support dual processor architecture; especially two socket 370 processors on an adapter card.

In summary, the advantages of the dual processor adapter card of this invention include:

1. By the proper design of circuit layout, a single adapter card having dual processor architecture is easily achieved.
2. Since a pair of CPUs is installed on the same adapter card, a mainboard having a single CPU slot still has dual-processor architecture (if the mainboard supports IOAPIC).
3. The mainboard or the chipset need not be modified, only parts of the BIOS need to be updated.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A dual processor adapter card, comprising:
    an adapter card having a plurality of electrical pins for inserting into a processor slot on a mainboard; and a first and a second processor socket mounted on the adapter card for carrying a first and a second processor respectively, wherein the first and the second processor socket each has a plurality of corresponding pins, a portion of the pins of the first and the second processor socket corresponds to a portion of the electrical pins of the adapter card, and the corresponding pins of the first socket, the second socket, and the electrical pins of the adapter card are electrically coupled together; and a zero-delay buffer mounted on the adapter card and coupled to the first and the second processor socket with the same distances for synchronizing clock pulse signals to a first and a second processors.

2. The dual processor adapter card of claim 1, wherein the corresponding pins are coupled together using a daisy chain method.

3. The dual processor adapter card of claim 1, wherein each of the pins that act as a terminal pin between the first and the second processor socket is connected to a pull-up resistor, and the pull-up resistor is connected to a terminal voltage.

4. The dual processor adapter card of claim 3, wherein the distance between the terminal voltage and the terminal pin on the first or the second processor socket through the pull-up resistor is smaller than one inch.

5. The dual processor adapter card of claim 1, wherein the pull-up resistor is 56 Ohms.

6. The dual processor adapter card of claim 1, further comprising a voltage regulator mounted on the adapter card and coupled to the first and the second processor socket for converting a power voltage into a suitable working voltage for the first and the second processors.

7. The adapter card of claim 6, wherein the working voltage provided by the voltage regulator to the first and the second processor is about 2.5V.

8. The dual processor adapter card of claim 1, wherein the first and the second processor socket include a socket of socket 370 specification.

9. The dual processor adapter card of claim 1, wherein the processor slot on the mainboard includes a slot of slot 1 specification.

10. The dual processor adapter card of claim 1, wherein the electrical pins on the adapter card form a structure of gold fingers.

11. A dual processor adapter card for inserting into a mainboard having a least a processor slot, wherein the adapter card has a plurality of electrical pins for electrical connection with the mainboard when the gold fingers are inserted into the processor slot, the adapter card comprising:

a first and a second processor socket mounted on the adapter card for carrying a first and a second processor respectively, wherein the first and the second processor socket each has a plurality of corresponding pins, a portion of the pins of the first and the second processor socket corresponds to a portion of the electrical pins of the adapter card, and the corresponding pins of the first socket, the second socket, and the electrical pins of the adapter card are electrically coupled together; and a voltage regulator mounted on the adapter card and coupled to the first and the second processor socket for converting a power voltage into a suitable working voltage for the first and the second processors.

12. The adapter card of claim 11, wherein the corresponding pins are coupled together using a daisy chain method.

13. The dual processor adapter card of claim 11, wherein each of the pins that act as a terminal pin between the first and the second processor socket is connected to a transceiver logic, and the transceiver logic is connected to a terminal voltage, wherein the transceiver logic uses a pull up resistor such that one end of the pull-up resistor is connected to a pin serving as the terminal pin between the corresponding pins of the first and the second processor socket while the other end of the pull-up resistor is connected to a terminal voltage.

14. The dual processor adapter card of claim 13, wherein the pull-up resistor is 56 Ohms.

15. The dual processor adapter card of claim 14, wherein the distance between the terminal voltage and the terminal pin on the first or the second processor socket through the pull-up resistor is smaller than one inch.

16. The dual processor adapter card of claim 11, further comprising a zero-delay buffer mounted on the adapter card and coupled to the first and the second processor socket with the same distances for synchronizing clock pulse signals to a first and a second processors.

17. The adapter card of claim 11, wherein the working voltage provided by the voltage regulator to the first and the second processor is about 2.5V.

18. The dual processor adapter card of claim 11, wherein the first and the second processor socket include a socket of socket 370 specification.

19. The adapter card of claim 11, wherein the processor slot on the mainboard includes a slot of slot 1 specification.

20. The dual processor adapter card of claim 11, wherein the electrical pins on the adapter card form a structure of gold fingers.

* * * * *